United States Patent
Honma

[11] Patent Number: 5,889,433
[45] Date of Patent: Mar. 30, 1999

[54] AMPLIFIER HAVING A HIGH CURRENT EFFICIENCY

[75] Inventor: Tomoyuki Honma, Yokohama, Japan

[73] Assignee: Kabushiki Kaisha Toshiba, Kawasaki, Japan

[21] Appl. No.: 880,694

[22] Filed: Jun. 23, 1997

[30] Foreign Application Priority Data

Jun. 24, 1996 [JP] Japan ................................. 8-163037

[51] Int. Cl.$^6$ ........................................................ H03F 3/26
[52] U.S. Cl. ........................................... 330/273; 330/274
[58] Field of Search .................................... 330/262, 263, 330/267, 268, 273, 274, 296; 381/120

[56] References Cited

U.S. PATENT DOCUMENTS 4,025,871  5/1977  Peil ...................................... 330/262 X
5,160,897  11/1992  Fujisawa et al. ........................ 330/274

FOREIGN PATENT DOCUMENTS

4-111507  4/1992  Japan .
8 2009    1/1996  Japan .

Primary Examiner—Steven J. Mottola
Attorney, Agent, or Firm—Oblon, Spivak, McClelland, Maier & Neustadt, P.C.

[57] ABSTRACT

While no signals are being supplied to first and second drive circuits, the drive circuits keep supplying idling currents to the bases of first and second transistors which constitute a push-pull amplifier. A first control circuit is provided in the base-emitter path of the first transistor, to control the first transistor in accordance with an input signal. A second control circuit is provided in the base-emitter path of the second transistor, to control the second transistor in accordance with an input signal. The first control circuit comprises a third transistor, a first resistor connected between the collector and base of the third transistor, a third resistor connected between the collector of the third transistor and the base of the first transistor, a constant current source connected to the base of the third transistor. The second control circuit comprises a fourth transistor, a second resistor connected between the collector and base of the fourth transistor, a fourth resistor connected between the collector of the fourth transistor and the base of the second transistor, a constant current source connected to the base of the fourth transistor.

19 Claims, 5 Drawing Sheets

1
AMPLIFIER HAVING A HIGH CURRENT EFFICIENCY

BACKGROUND OF THE INVENTION

The present invention relates to an amplifier for use in, for example, audio apparatuses, and more particularly to an amplifier which performs push-pull amplification on the input signal, thereby acquiring a high current efficiency.

Figure 8:
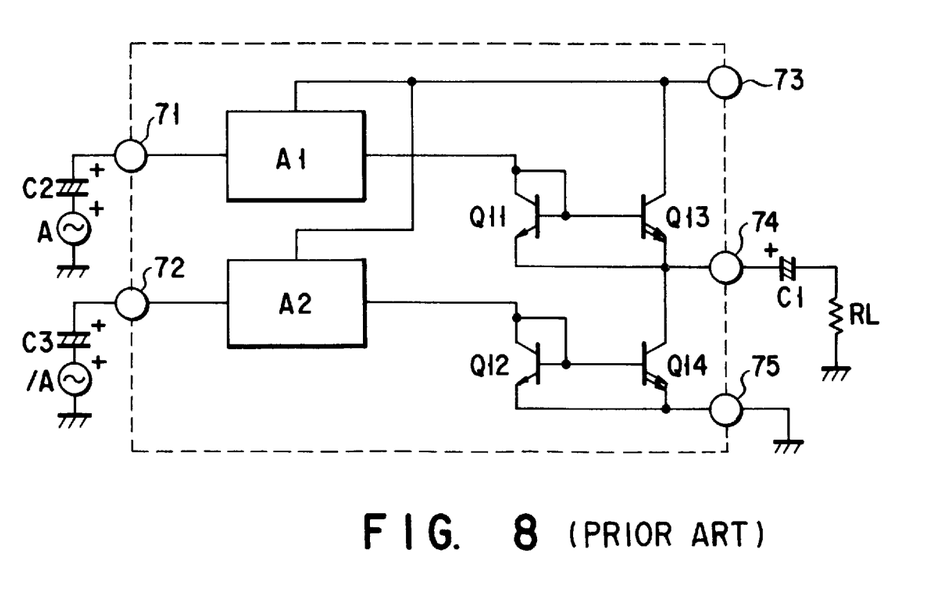
FIG. 8 is a circuit diagram showing a conventional amplifier.

FIG. 8 shows a conventional circuit disclosed in Jpn. Pat. Appln. KOKAI Publication 4-111507, which is designed for use in the output section of an audio apparatus. The circuit comprises two drive circuits A1 and A2, four transistors Q11 to Q14, two input terminals 71 and 72, a power-supply terminal 73, an output terminal 74, and a ground terminal 75. The inputs of the drive circuits A1 and A2 are connected to the input terminals 71 and 72, respectively. The transistors Q11 and Q13 constitute a first current mirror circuit, and the transistors Q12 and Q14 constitute a second current mirror circuit. The output of the drive circuit A1 is connected to the collector of the transistor Q11 and also to the bases of the transistors Q11 and Q13. The collector of the transistor Q13 is connected to the power-supply terminal 73. The emitter of the transistor Q13 is connected to the output terminal 74, together with the emitter of the transistor Q11. The output of the drive circuit A2 is connected to the collector of the transistor Q12 and also to the bases of the transistors Q12 and Q14. The collector of the transistor Q14 is connected to the output terminal 74. The emitter of the transistor Q14 is connected to the ground terminal 75, together with the emitter of the transistor Q12.

In the circuit shown in FIG. 8, an input signal A is supplied to an input terminal 71 through a capacitor C2, while an input signal /A, which is opposite to the signal A, in phase is supplied to the other input terminal 72 through a capacitor C3. The circuit operates as a push-pull amplifier. When its output terminal 74 is connected to a load RL through a capacitor C1, the circuit supplies the load RL with a current which is a product of the output current of the drive circuit A1 and the current mirror ratio of the first current mirror circuit or with a current which is a product of the output current of the drive circuit A2 and the current mirror ratio of the second current mirror circuit.

The drive circuit A1 and the transistors Q11 and Q13 constitute a first amplifier circuit, which amplifies the positive half of the input-signal wave. The drive circuit A2 and the transistors Q12 and Q14 constitute a second amplifier circuit, which amplifies the negative half of the input-signal wave. The first and second amplifier circuits are identical in structure. The circuit shown in FIG. 8 therefore has but a little distortion rate.

Both drive circuits A1 and A2 output an idling current each, even while they are receiving no input signals. Therefore, a current which is the product of the idling current and the current mirror ratio of the first current mirror circuit flows through the transistor Q13, and a current which is the product of rib the idling current and the current mirror ratio of the second current mirror circuit flows through the transistor Q14. Hence, the crossover distortion in the circuit of FIG. 8 is small.

To have a great amplification factor, either current mirror circuit needs to have a large current mirror ratio. If the current mirror circuits have their current mirror ratios increased, however, the idling currents flowing in the transistors Q13 and Q14 while no signals are being supplied to the drive circuits A1 and A2 will increase. Consequently, the circuit of FIG. 8 will consume more power.

2

Figure 9:
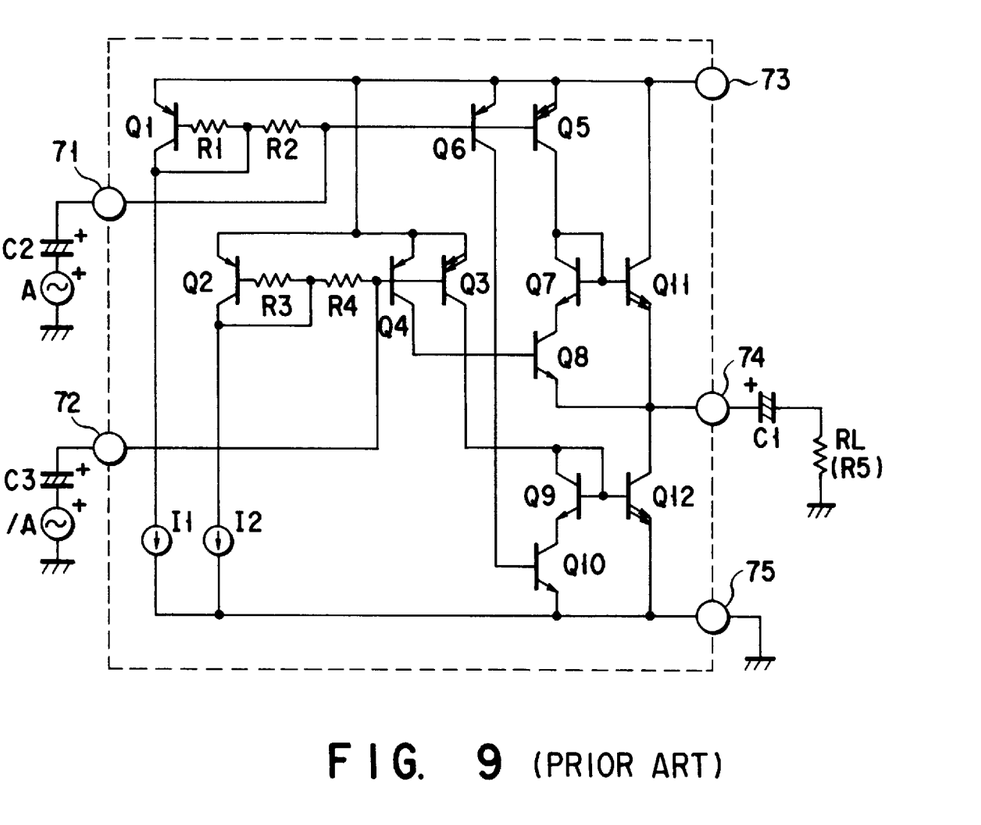
FIG. 9 is a circuit diagram illustrating another conventional amplifier.

FIG. 9 shows a B-class push-pull amplifier which is disclosed in Jpn. Pat. Appln. KOKAI Publication No. 8-2009. In this amplifier, the transistors Q8 and Q10 remains on while no signals are being supplied to the input terminals 71 and 72. The emitter-current path between the diode-connected transistors Q7 and Q9 is rendered conducting. As long as this path remains conducting, the transistors Q7, Q8 and Q11 constitute a current mirror circuit, and the transistors Q9, Q10 and Q12 constitute a current mirror circuit. While no signals are being supplied to the input terminals 71 and 72, the idling current (i.e., output current) of either current mirror circuit is determined by the current mirror ratio.

While input signals are being supplied to the input terminals 71 and 72, the transistors Q8 and Q10 are alternately turned off in accordance with the polarities of the input signals. As a result, the transistors Q7 and Q9 are alternately turned off. When the transistor Q7 is off, all collector current of the transistor Q5 is supplied to the base of the transistor Q11. When the transistor Q9 is off, all collector current of the transistor Q3 is supplied to the base of the transistor Q12. The output current supplied from the output terminal 74 therefore depends on the current amplification factor of the transistor Q11 or Q12.

As indicated above, the transistors Q8 and Q10 remain on while no signals are being supplied to the input terminals 71 and 72. In these transistors Q8 and Q10, a collector-emitter saturation voltage VCE(SAT) is generated. The voltage VCE(SAT) causes the idling current to change by the value determined by the emitter-area ratio of the transistors Q7 and Q9 and the emitter-area ratio of the transistors Q11 and Q12. The voltages VCE(SAT) of the transistors Q8 and Q10 are difficult to control during the manufacture.

Furthermore, when the push-pull amplifier has its maximum current amplification factor, the transistors Q3 and Q4 or the transistors Q5 and Q6 are turned off. Since, the transistors Q8 and Q10 are saturated while operating, some times elapses until the transistors Q3 and Q4 or the transistors Q5 and Q6 are turned on. This inevitably increases the possibility of ringing.

BRIEF SUMMARY OF THE INVENTION

An object of the present invention is to provide an amplifier in which idling currents do not increase or change greatly and which therefore has a high current efficiency.

Another object of the invention is to provide an amplifier in which oscillation is suppressed and which can therefore operates with high stability.

To attain the object, an amplifier according to the invention comprises: an output terminal; a power-supply terminal; a first transistor of emitter follower type having an emitter connected to the output terminal, a collector connected to the power-supply terminal and a base connected to receive a signal current; a second transistor having an emitter connected to the ground, a collector connected to the output terminal and a base connected to receive a signal current, the first and second transistors constituting a push-pull amplifier; a first drive circuit having a first input terminal connected to receive a signal and a first output terminal connected to the base of the first transistor, and designed to output an idling current from the first output terminal when no signal is supplied to the first input terminal; a second drive circuit having a second input terminal connected to receive a signal opposite in phase to the signal supplied to the first input terminal and a second output terminal connected to the base of the second transistor, and designed to output an idling current from the second output terminal when no signal is supplied to the second input terminal; a first control circuit connected between the base and emitter of the first transistor, for supplying most of the idling current output from the first output terminal, thereby to reduce an idling current flowing through the base of the first transistor, and for controlling a base-emitter voltage of the first transistor in accordance with the signal supplied to the first input terminal; and a second control circuit connected between the base and emitter of the second transistor, for supplying most of the idling current output from the first output terminal, thereby to reduce an idling current flowing through the base of the second transistor, and for controlling a base-emitter voltage of the second transistor in accordance with the signal supplied to the second input terminal.

The output currents of the first and second drive circuits are amplified by the current mirror ratios thereof, respectively, when no signals are supplied to the first and second input terminals, and by the current gains β of the first and second drive circuits when the signals supplied to the first and second input terminals have a large amplitude. The idling currents can therefore be decreased, whereby the amplifier circuit outputs a sufficiently large current. Further, the areas of the first and second transistors can be reduced, making it possible provide the amplifier circuit in the form of a small IC chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the invention will be described, with reference to the accompanying drawings.

Figure 1:
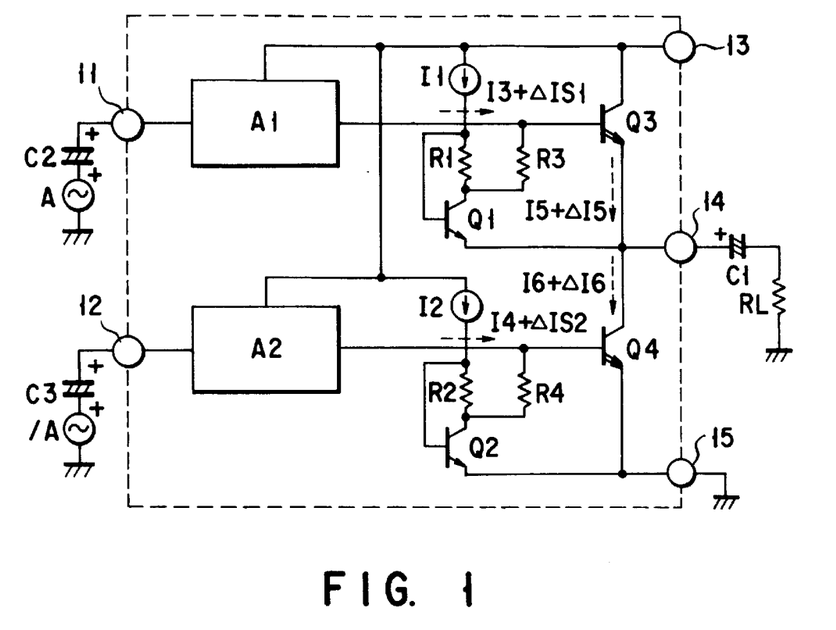
FIG. 1 is a circuit diagram showing first embodiment of the invention.

FIG. 1 shows an amplifier according to the first embodiment of the invention. The amplifier has an output-stage amplifying circuit which has its current amplification factor varied in accordance with the amplitudes of the input signals. The amplifier is therefore different from the conventional amplifier in which the output-stage amplifying circuit is composed of current mirror circuits each having a fixed amplification factor.

As seen from FIG. 1, an input signal A is supplied to a input terminal 11 through a capacitor C2. An input signal /A opposite in phase to the signal A is supplied to a input terminal 12 through a capacitor C3. The input terminal 11 is connected to the input terminal of a drive circuit A1. The output of the drive circuit A1 is connected to the collector of a transistor Q1 by a resistor R3 and also to the base of a transistor Q3. A constant current source I1 has one end connected to a power-supply terminal 13. The other end of the current source I1 is connected to the base of the transistor Q1 and also to the collector thereof by a resistor R1. The collector of the transistor Q3 is connected to the power-supply terminal 13. The emitter of the transistor Q3 is connected to an output terminal 14, along with the emitter of the transistor Q1.

The signal input to the input terminal 12 is supplied to the input of a drive circuit A2. The output of the drive circuit A2 is connected to the collector of a transistor Q2 by a resistor R4, and also to the base of a transistor Q4. A constant current source I2 has one end connected to the power-supply terminal 13. The other end of the current source I2 is connected to the base of the transistor Q2 and also to the collector of the transistor Q2 by a resistor R2. The collector of the transistor Q4 is connected to the output terminal 14. The emitter of the transistor Q3 is connected to a ground terminal 15, along with the emitter of the transistor Q2. Power is supplied to both drive circuits A1 and A2 from the power-supply terminal 13.

How the amplifier shown in FIG. 1 operates will be explained.

While no signal is supplied to the input terminal 11, the drive circuit A1 keeps outputting an idling current I3. The base-emitter voltage VBEQ3 of the transistor Q3 is given as:

$$VBEQ3 = VBEQ1 + (-R1 \cdot I1 + R3 \cdot I3)$$

where VBEQ1 is the base-emitter voltage of the transistor Q1. The voltage VBEQ3 is of such a value that the emitter current starts to flow in the transistor Q3. Hence, the greater part of the current I3 flows through the resistor R3; the current I3 scarcely flows through the base of the transistor Q3. The emitter current of the transistor Q3, i.e., idling current I5, is determined by the ratio between the currents I1 and I3, the ratio between the resistances of the resistors R1 and R3, and the emitter-area ratio between the transistors Q1 and Q3 (i.e., the current mirror ratio).

If I1:I3=1:N1, R1:R3=N1:1, the emitter area of the transistor Q1:the emitter area of the transistor Q3=1:N2, where N1 is 1 or a greater number (e.g., 2), and N2 is 1 or a greater number (e.g., 4). The idling current I5 is given as follows:

$$I5 = N2 \cdot (1/N1 + 1) \cdot I3$$
$$= N2 \cdot (N1 + 1) \cdot I1$$

The idling current I5 which flows while no signal is being supplied to the input terminal 11 is a current amplified by the current mirror ratio. It can therefore have such a value as to reduce the crossover distortion, only if the resistors R1 and R2, the output current of the constant current source Ii and the current mirror ratio are set at appropriate values.

In the amplifying circuit constituted by the transistors Q2 and Q4, the resistors R2 and R4 and the constant current source I2, the collector current of the transistor Q4, i.e., idling current I6, can be set in the same way as the idling current I5, if the drive circuit A2 keeps generating a current I4 while no signal is supplied to the input terminal 12. The emitter current of the transistor Q1 flows to the collector of the transistor Q4. The transistor Q4 needs to have an emitter area large enough to absorb that part of the emitter current of the transistor Q1.

Assume a signal A is supplied to the input terminal 11, and that a signal /A opposite in phase to the signal A is supplied to the input terminal 12. Then, the output currents I3 and I4 of the drive circuits A1 and A2 increase by $\Delta$ IS1 and $\Delta$ IS2, respectively. The output currents I5 and I6 of the transistors Q3 and Q4, which are to be supplied to the load RL, increase by $\Delta$ I5 and $\Delta$ I6, respectively.

When the input signal A has a relatively small amplitude, most of the current $\Delta$ IS1 flows through the resistor R3 and the voltage VBEQ3 increases by R3·$\Delta$ IS1 which is a voltage drop at the resistor R3. Hence, $\Delta$ I5 exponentially increases as $\Delta$ IS1 increases. The same holds true of $\Delta$ IS2 and $\Delta$ I6.

When the input signal A has a relatively large amplitude, $\Delta$ I5 exponentially increases as the voltage VBEQ3 increases. In this case, the voltage VBEQ3 scarcely increases even if $\Delta$ I5 increases, and VBEQ3=VBEQ1−(voltage drop at the resistor R1)+(voltage drop at the resistor R3). Thus, $\Delta$ IS1 scarcely flows though resistor R3, and flows through the base of the transistor Q3. Therefore, $\Delta$ I5 approaches $\beta$·$\Delta$ IS1, where $\beta$ is the current gain of the transistor Q3. The same holds true of $\Delta$ IS2 and $\Delta$ I6.

In the first embodiment, either amplifying circuit can have its amplification changed to one value when no signal is supplied to the associated drive circuit and to another value when a signal of a large amplitude is supplied to the associated drive circuit. The current mirror ratios of the amplifying circuits can therefore be decreased to be smaller than the current gains $\beta$ of the transistors Q3 and Q4, respectively. The amplifier can therefore supply a large current to the load RL without increasing the idling currents in the amplifying circuits. Further, the areas of the transistors Q3 and Q4 are decreased in proportion to the current mirror ratios of both amplifying circuits, whereby the amplifier can have a chip area smaller than otherwise.

While no signals are supplied to the input terminals 11 and 12, the idling current I5 is determined by only the ratio between the resistances of the resistors R1 and R3 and the emitter-area ratio between the transistors Q1 and Q3, while the idling current I6 is determined by only the ratio between the resistances of the resistors R2 and R4, and the emitter-area ratio between the transistors Q2 and Q4. Thus, both idling currents I5 and I6 change but only a little. While one amplifying circuit is operating, the transistors incorporated in the other amplifying circuit remain conducting, too. An operating delay does not occur in the amplifying circuits as in the conventional amplifier. The amplifier shown in FIG. 1 reliably operates, not oscillating at all.

Figure 2:
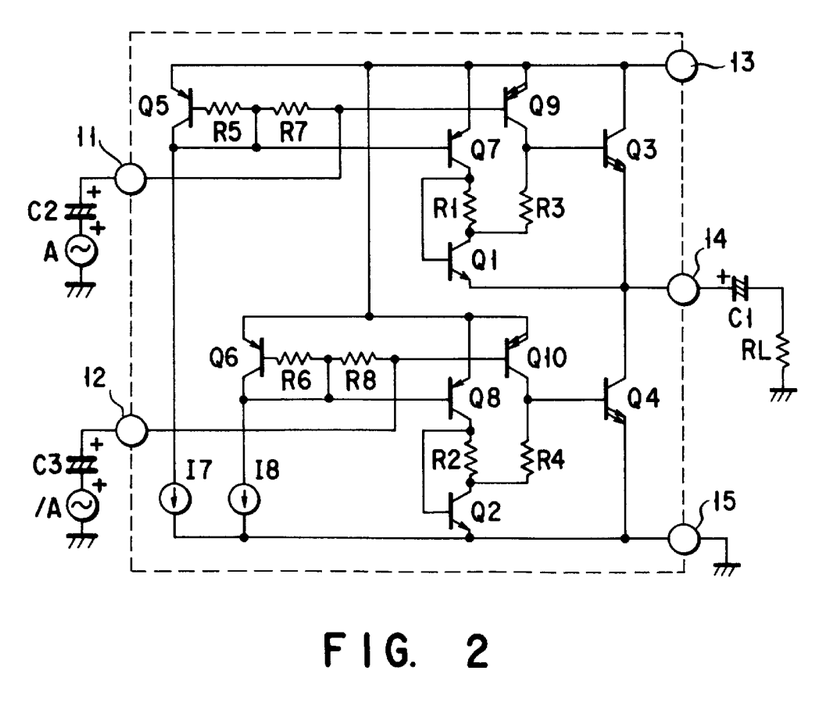
FIG. 2 is a circuit diagram showing a modification of the first embodiment.

FIG. 2 shows a modification of the first embodiment illustrated in FIG. 1. The modified amplifier is characterized in the drive circuits A1 and A2 and the constant current sources I1 and I2. In FIG. 2, the components similar or identical to those shown in FIG. 1 are designated by the same reference numerals.

As illustrated in FIG. 2, an input terminal 11 is connected to one end of a resistor R7 and the base of a transistor Q9. The other end of the resistor R7 is connected to one end of a resistor R5, the collector of a transistor Q5 and the base of a transistor Q7. The other end of the resistor R5 is connected to the base of the transistor Q5. The collector of the transistor Q5 is connected to ground terminal 15 by a constant current source I7. The emitters of the transistors Q5, Q7 and Q9 are connected to a power-supply terminal 13. The collector of the transistor Q7, or the output of the constant current source I1 (FIG. 1) is connected to one end of a resistor R1 and the base of a transistor Q1. The collector of the transistor Q9 is the output of the drive circuit A1.

A signal A is supplied through a capacitor C2 to the input terminal 11. A signal /A opposite in phase to the signal A is supplied through a capacitor C3 to an input terminal 12. The input terminal 12 is connected to one end of a resistor R8 and the base of the transistor Q10. The other end of the resistor R8 is connected one end of a resistor R6, the collector of a transistor Q6 and the base of a transistor Q8. The other end of the resistor R6 is connected to the base of the transistor Q6. The collector of the transistor Q6 is connected to the ground terminal 15 by a constant current source I8. The emitters of the transistors Q6, Q8 and Q10 are connected to the power-supply terminal 13. The collector of the transistor Q8, which is the output of the constant current source I2 (FIG. 1), is connected to the base of a transistor Q2 and also to the collector of the transistor Q2 by a resistor R2. The collector of the transistor Q10 is the output of the drive circuit A2.

The modified amplifier of FIG. 2 operates in the same way as the amplifier shown in FIG. 1.

Figure 3:
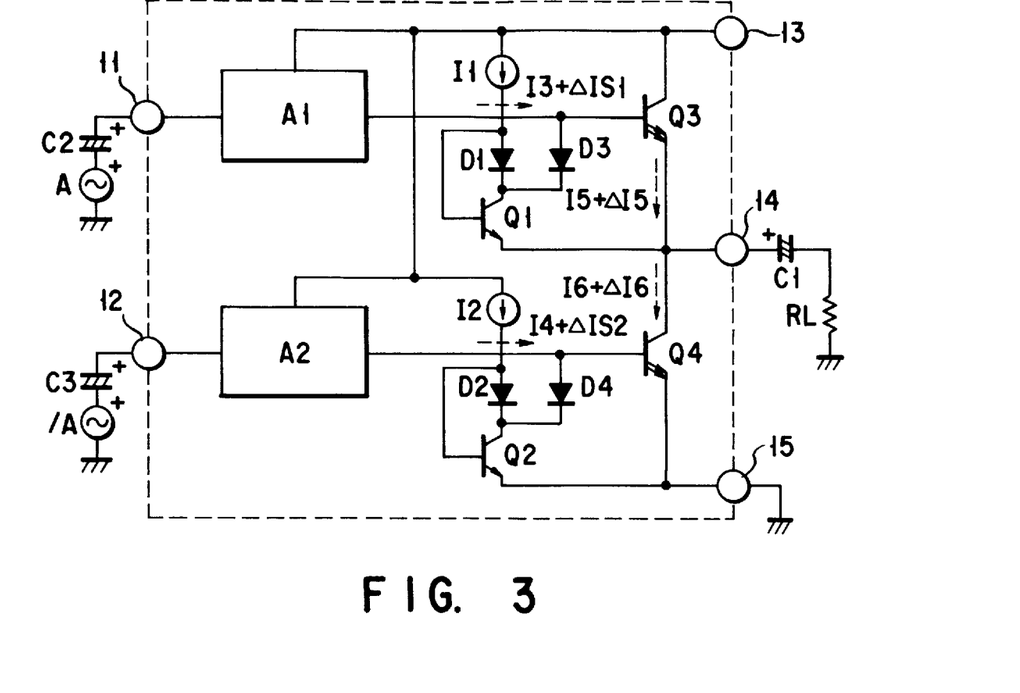
FIG. 3 is a circuit diagram showing a second embodiment of the invention.

FIG. 3 illustrates an amplifier according to the second embodiment of the present invention. The second embodiment differs from the first embodiment (FIG. 1) in that diodes D1 to D4 are used in place of the resistors R1 to R4.

As seen from FIG. 3, the anode of the diode D1 is connected to the output of a constant current source I1 and also to the base of a transistor Q1. The cathode of the diode D1 is connected to the collector of the transistor Q1. The anode of the diode D3 is connected to the output of drive circuit A1, and the cathode of the diode D3 to the collector of the transistor Q1. The anode of the diode D2 is connected to the output of a constant current source I2 and the base of a transistor Q2. The cathode of the diode D2 is connected to the collector of the transistor Q2. The anode of the diode D4 is connected to the output of the drive circuit A2, and the cathode of the diode D4 to the collector of the transistor Q2.

While no signal is being supplied to the input terminal 11, the base-emitter path of a transistor Q3 is biased with a voltage VBEQ1−VFD1+VFD3, where VFD1 and VFD3 are respectively the voltage drops at the diodes D1 and D3. A desired idling current I5 can therefore be obtained as in the first embodiment, by selecting appropriate values for the ratio between currents I1 and I3, the area ratio between the diodes D1 and D3 and the emitter-area ratio between the transistors Q1 and Q3.

When a signal A of a relatively small amplitude is supplied to the input terminal 11, the output current I3 of the drive circuit A1 increases by $\Delta$ IS1. This current increase $\Delta$ IS1 flows to the diode D3 and the base of the transistor Q3, raising both VDF3 and VBEQ3. In this case, the diode D1 prevents the current flowing in the diode D3 from flowing to the base of the transistor Q1. The output current of the drive circuit A1 does not flow via the resistors R3 and R1 to the base of the transistor Q1 as in the amplifier according to the first embodiment. Thus, the base current of the transistor Q1 has a small increase, and the current flowing through the diode D3 scarcely increases. Most of the current $\Delta$ IS1 therefore flows to the base of the transistor Q3 while the input terminal 11 is receiving a signal A of a small amplitude.

When the amplitude of the signal A supplied to the input terminal 11 increases, the base-emitter voltage VBEQ3 of the transistor Q3 is prevented from rising. The idling current I5 approaches a value $\beta \cdot \Delta$ IS1, where $\beta$ is the current gain of the transistor Q3.

The same can be said of the amplifying circuit which is constituted by the transistors Q2 and Q4, the diodes D2 and D4 and the constant current source I2.

Like the first embodiment, the second embodiment can acquire a large current amplification factor, without increasing the idling currents.

Figure 4:
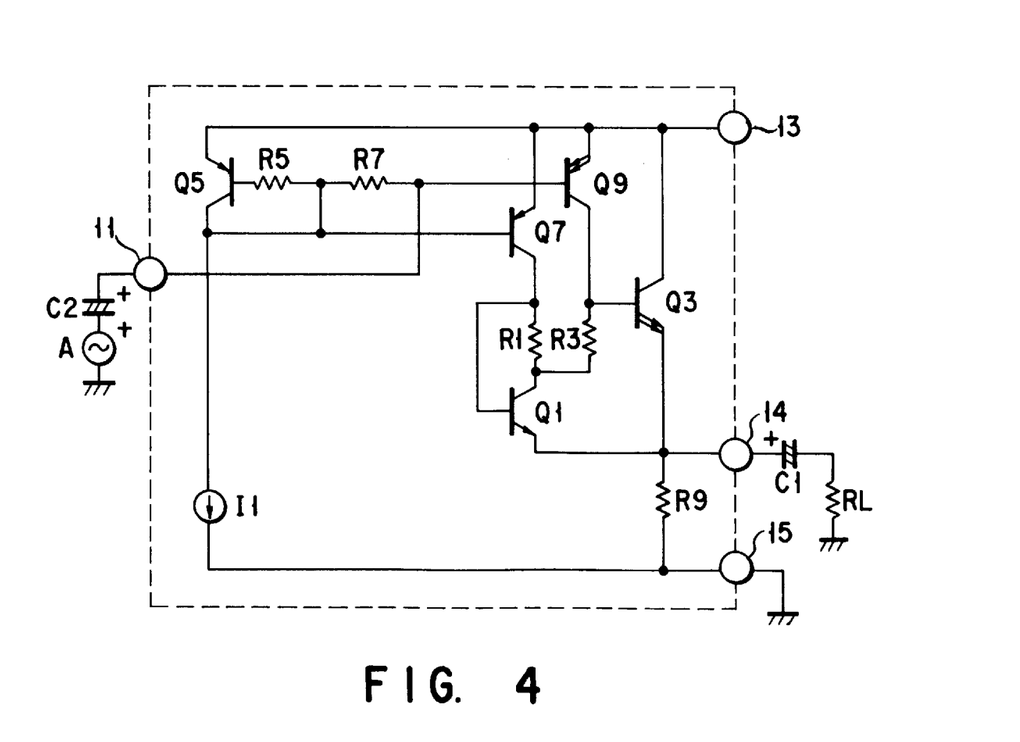
FIG. 4 is a circuit diagram illustrating a third embodiment of this invention.

FIG. 4 shows an amplifier according to the third embodiment of this invention. The third embodiment is an amplifier which is a half part of the push-pull circuit illustrated in FIG. 2 and which functions as an A class amplifier. In FIG. 4, the components similar or identical to those shown in FIG. 2 are designated by the same reference numerals.

As shown in FIG. 4, a resistor R9 is connected between the ground terminal 15 and the emitter node of transistors Q1 and Q3.

Like the first embodiment, the third embodiment can acquire a large current amplifier factor, without increasing the idling currents.

In the third embodiment, an intermediate voltage of the signal output from the output terminal 14 in response to the input signal can be set at any desired value by adjusting the resistance of the resistor R9 and the current set by the transistors Q1, Q3, Q7 and Q9, and resistors R1 and R3. The intermediate voltage may be set (Vcc−VF)/2, where the Vcc is the power-source voltage, and VF is forward voltage of the transistor Q3.

Figure 5:
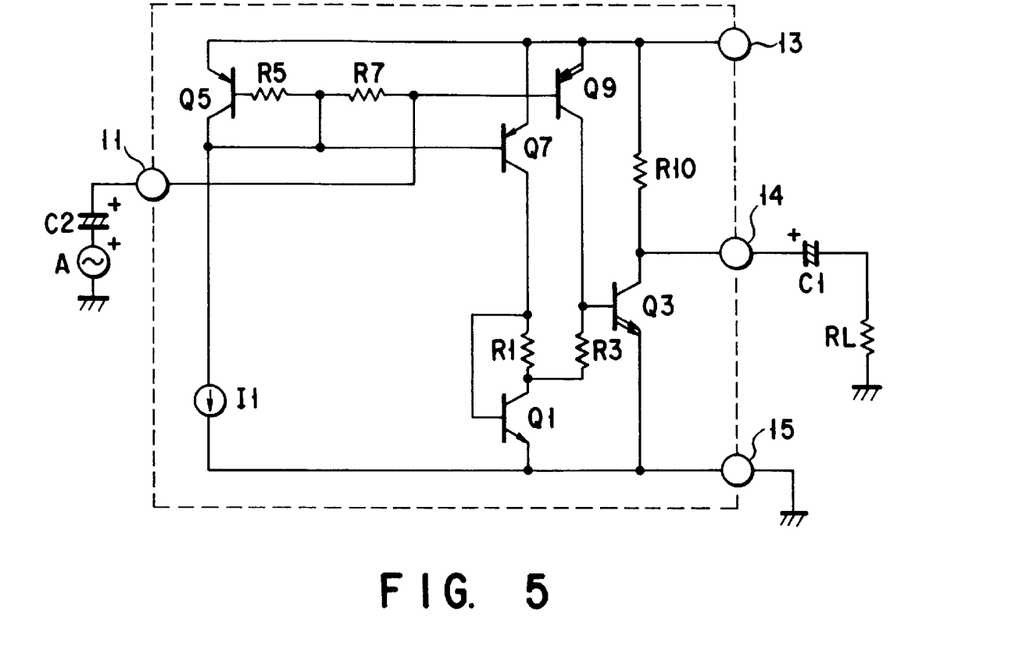
FIG. 5 is a circuit diagram showing a fourth embodiment of the invention.

FIG. 5 shows an amplifier according to the fourth embodiment of the invention. The fourth embodiment is a modification of the third embodiment illustrated in FIG. 4. In FIG. 5, the components which are similar or identical to those shown in FIG. 4 are designated by same reference numerals.

As shown in FIG. 5, the emitter node of transistor Q1 and Q3 is connected to the ground terminal 15, and the collector of the transistor Q3 is connected to the output terminal 14. A resistor R10 is connected between the power-supply terminal 13 and the collector of the transistor Q3. The fourth embodiment can obtain advantages similar to those of the third embodiment. In the fourth embodiment, the intermediate voltage may be set to Vcc/2.

Figure 6:
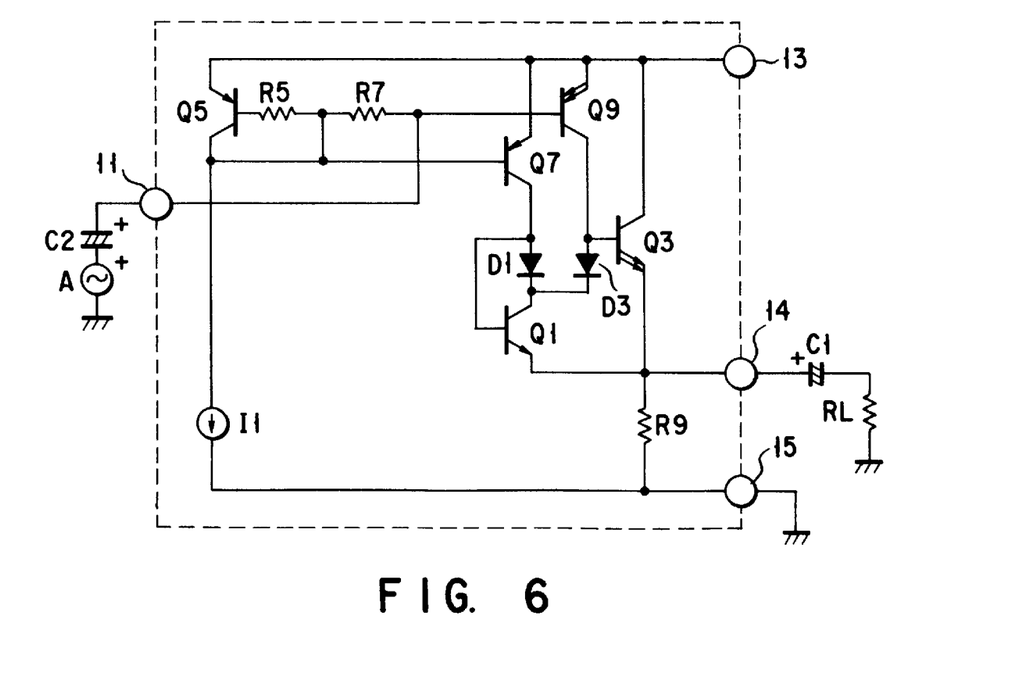
FIG. 6 is a circuit diagram depicting a fifth embodiment of the present invention.
Figure 7:
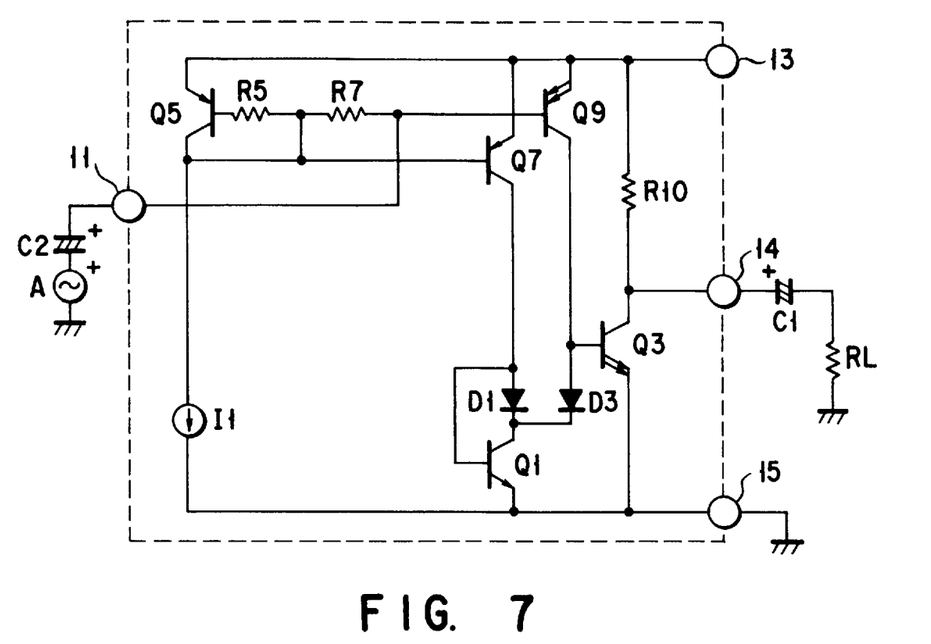
FIG. 7 is a circuit diagram illustrating a sixth embodiment of the invention.

FIG. 6 shows an amplifier according to the fifth embodiment of the present invention. This embodiment is another modification of the third embodiment shown in FIG. 4. FIG. 7 shows an amplifier according to the sixth embodiment of the invention. The sixth embodiment is a modification of the fourth embodiment shown in FIG. 5. In FIGS. 6 and 7, the components which are similar or identical to those shown in FIGS. 4 and 5 are designated by the same reference numerals.

In the fifth and sixth embodiments (FIGS. 6 and 7), diodes D1 and D3 are used in place of the resistors R1 and R3 (FIGS. 4 and 5). The fifth and sixth embodiments can achieve the same advantages as the third and fourth embodiments. Moreover, they can have a higher integration density than the third and fourth embodiments since the diodes D1 and D3 are used in place of the resistors R1 and R3.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An amplifier circuit comprising:

an output terminal;

a power-supply terminal;

a first transistor of emitter follower type having an emitter connected to said output terminal, a collector connected to said power-supply terminal and a base connected to receive a signal current;

a second transistor having an emitter connected to the ground, a collector connected to said output terminal and a base connected to receive a signal current, said first and second transistors constituting a push-pull amplifier;

a first drive circuit having a first input terminal connected to receive a signal and a first output terminal connected to the base of said first transistor, and designed to output an idling current from the first output terminal when no signal is supplied to the first input terminal;

a second drive circuit having a second input terminal connected to receive a signal opposite in phase to the signal supplied to said first input terminal and a second output terminal connected to the base of said second transistor, and designed to output an idling current from the second output terminal when no signal is supplied to the second input terminal;

a first control circuit connected between the base and emitter of said first transistor, for supplying most of the idling current output from said first output terminal, thereby to reduce an idling current flowing through the base of said first transistor, and for controlling a base-emitter voltage of the first transistor in accordance with the signal supplied to said first input terminal; and a second control circuit connected between the base and emitter of said second transistor, for supplying most of the idling current output from said first output terminal, thereby to reduce an idling current flowing through the base of said second transistor, and for controlling a base-emitter voltage of the second transistor in accordance with the signal supplied to said second input terminal.

2. A circuit according to claim 1, wherein first control circuit comprises:

a third transistor having a base, a collector and an emitter;

a first resistor connected between the collector and base of said third transistor;

a first constant current source connected to the base of said third transistor; and a second resistor connected between the base of said first transistor and the collector of said third transistor, for applying a collector potential of said third transistor to the base of said first transistor as a bias power supply for a base-emitter path of said first transistor.

3. A circuit according to claim 2, wherein said second control circuit comprises:

a fourth transistor having a base, a collector and an emitter;

a third resistor connected between the collector and base of said fourth transistor;

a second constant current source connected to the base of said fourth transistor; and a fourth resistor connected between the base of said second transistor and the collector of said fourth transistor, for applying a collector potential of said fourth transistor to the base of said second transistor as a bias power supply for a base-emitter path of said second transistor.

4. A circuit according to claim 2, wherein the ratio of an emitter area of said first transistor to an emitter area of said third transistor is less than a current amplification factor of grounded emitter of said first transistor.

5. A circuit according to claim 3, wherein the ratio of an emitter area of said second transistor to an emitter area of said fourth transistor is less than a current amplification factor of grounded emitter of said second transistor.

6. A circuit according to claim 1, wherein said first control circuit comprising:

a third transistor having a base, a collector and an emitter;

a first diode connected between the collector and base of said third transistor;

a first constant current source connected to the base of said third transistor; and a second diode connected between the base of said first transistor and the collector of said third transistor, for applying a collector potential of said third transistor to the base of said first transistor as a bias power supply for a base-emitter path of said first transistor.

7. A circuit according to claim 1, wherein said second control circuit comprises:

a fourth transistor having a base, a collector and an emitter;

a third diode connected between the collector and base of said fourth transistor;

a second constant current source connected to the base of said fourth transistor; and a fourth diode connected between the base of said second transistor and the collector of said fourth transistor, for applying a collector potential of said forth transistor to the base of said second transistor as a bias power supply for a base-emitter path of said second transistor.

8. An amplifier circuit comprising:

an output terminal;

a power-supply terminal;

a first transistor of emitter follower type having an emitter connected to said output terminal, a collector connected to said power-supply terminal and a base connected to receive a signal current;

a second transistor having an emitter connected to the ground, a collector connected to said output terminal and a base connected to receive a signal current, said first and second transistors constituting a push-pull amplifier;

a third transistor having a base, a collector and an emitter;

a first resistor connected between the collector and base of said third transistor;

a first constant current source connected to the base of said third transistor;

a fourth transistor having a base, a collector and an emitter;

a second resistor connected between the collector and base of said fourth transistor;

a second constant current source connected to the base of said fourth transistor;

a third resistor connected between the base of said first transistor and the collector of said third transistor, for applying a collector potential of said third transistor to the base of said first transistor as a base-emitter bias power supply for the first transistor; and a fourth resistor connected between the base of said second transistor and the collector of said fourth transistor, for applying a collector potential of said fourth transistor to the base of said second transistor as a base-emitter bias power supply for said second transistor.

9. A circuit according to claim 8, wherein the ratio of an emitter area of said first transistor to an emitter area of said third transistor is less than a current amplification factor of grounded emitter of said first transistor, and the ratio of an emitter area of said second transistor to an emitter area of said fourth transistor is less than a current amplification factor of grounded emitter of said second transistor.

10. A circuit according to claim 8, further comprising:

a first drive circuit having a first input terminal connected to receive a signal and a first output terminal connected to the base of said first transistor, and designed to output an idling current from the first output terminal when no signal is supplied to the first input terminal; and a second drive circuit having a second input terminal connected to receive a signal opposite in phase to the signal supplied to said first input terminal and a second output terminal connected to the base of said second transistor, and designed to output an idling current from the second output terminal when no signal is supplied to the second input terminal.

11. An amplifier circuit comprising:

an output terminal;

a first transistor having a base connected to receive an input signal, a collector connected to receive a power supply voltage, and an emitter connected to said output terminal;

a second transistor having a base, a collector and an emitter connected to the emitter of said first transistor;

a first diode having an anode connected to the base of said second transistor and a cathode connected to the collector of said second transistor;

a second diode having an anode connected to the base of said first transistor and a cathode connected to the collector of said second transistor;

a power-supply voltage source;

a first constant current source connected between the base of said second transistor and the power-supply voltage source;

a third transistor having a base connected to receive an input signal, a collector connected to said output terminal, and an emitter connected to the ground;

a fourth transistor having a base, a collector, and an emitter connected to the emitter of said third transistor;

a third diode having an anode connected to the base of said fourth transistor and a cathode connected to the collector of said fourth transistor;

a fourth diode having an anode connected to the base of said third transistor and a cathode connected to the collector of said fourth transistor; and a second constant current source connected between the base of said fourth transistor and the power-supply voltage source.

12. A circuit according to claim 11, wherein the ratio of an emitter area of said first transistor to an emitter area of said second transistor is less than a current amplification factor of grounded emitter of said first transistor, and the ratio of an emitter area of said third transistor to an emitter area of said fourth transistor is less than a current amplification factor of grounded emitter of said third transistor.

13. A circuit according to claim 11, further comprising:

a first drive circuit having an input terminal connected to receive a signal and an output terminal connected to the base of said first transistor, and designed to output an idling current from the output terminal when no signal is supplied to the input terminal; and a second drive circuit having an input terminal connected to receive a signal and an output terminal connected to the base of said third transistor, and designed to output an idling current from the output terminal when no signal is supplied to the input terminal.

14. An amplifier circuit comprising:

an output terminal;

a power-supply terminal;

a first transistor having a base connected to receive an input signal, a collector, and an emitter connected to said output terminal when the collector is connected to said power-supply terminal, and to the ground when the collector is connected to said output terminal;

a second transistor having a base, a collector, and an emitter connected to the emitter of said first transistor;

a first resistor connected between the base and collector of said second transistor;

a second resistor connected between the base of said first transistor and the collector of said second transistor; and a constant current source connected between the base of said second transistor and said power-supply terminal.

15. A circuit according to claim 14, further comprising a resistor connected between said output terminal and ground when the collector of said first transistor is connected to said power-supply terminal, and between said output terminal and said power-supply terminal when the collector of said first transistor is connected to the output terminal.

16. A circuit according to claim 14, wherein the ratio of an emitter area of said first transistor to an emitter area of said second transistor is less than a current amplification factor of grounded emitter of said first transistor.

17. An amplifier circuit comprising:

an output terminal;

a power-supply terminal;

a first transistor having a base connected to receive an input signal, a collector, and an emitter connected to said output terminal when the collector is connected to the power-supply terminal, and to the ground when the collector is connected to said output terminal;

a second transistor having a base, a collector, and an emitter connected to the emitter of said first transistor;

a first diode having an anode connected to the base of said second transistor and a cathode connected to the collector of said second transistor;

a second diode having an anode connected to the base of said first transistor and a cathode connected to the collector of said second transistor; and a first constant current source connected between the base of said second transistor and said power-supply terminal.

18. A circuit according to claim 17, further comprising a resistor connected between the ground and said output terminal when the collector of said first transistor is connected to the power-supply terminal, and between said output terminal and said power-supply terminal when the collector of said first transistor is connected to said output terminal.

19. A circuit according to claim 17, wherein the ratio of an emitter area of said first transistor to an emitter area of said second transistor is less than a current amplification factor of grounded emitter of said first transistor.

\* \* \* \* \*